United States Patent [19]

Berth et al.

[11] Patent Number: 4,469,528
[45] Date of Patent: Sep. 4, 1984

[54] METHOD OF MANUFACTURING A SEMICONDUCTOR DEVICE OF GAAS BY TWO SPECIES ION IMPLANTATION

[75] Inventors: Michel Berth, Antony; Camille Venger, Montfermeil; Gérard M. Martin, Paris, all of France

[73] Assignee: U.S. Philips Corporation, New York, N.Y.

[21] Appl. No.: 418,322

[22] Filed: Sep. 15, 1982

[30] Foreign Application Priority Data

Sep. 18, 1981 [FR] France ................ 81 17664

[51] Int. Cl.³ ............... H01L 29/34; H01L 21/265
[52] U.S. Cl. ................... 148/1.5; 148/187; 29/576 B; 357/61; 357/64; 357/91
[58] Field of Search ........... 148/1.5, 187; 29/576 B; 357/61, 64, 91

[56] References Cited

U.S. PATENT DOCUMENTS

| | | | |
|---|---|---|---|
| 4,017,887 | 4/1977 | Davies et al. | 357/52 |
| 4,383,869 | 5/1983 | Liu | 148/1.5 |
| 4,396,437 | 8/1983 | Kwok et al. | 148/1.5 |

OTHER PUBLICATIONS

Sansbury et al., Radiation Effects, 6 (1970) pp. 269–276.
Donnelly et al., Appl. Phys. Letts. 27 (1975) 41.
Favennec et al., In Ion Implantation in S/C, ed. Crowder, Plenum, N.Y. 1974, p. 621.

Primary Examiner—Upendra Roy
Attorney, Agent, or Firm—Paul R. Miller

[57] ABSTRACT

The invention relates to a method of treating a substrate of gallium arsenide by a double ion implantation. A first implantation of silicon ions ($Si^+$) is carried out on the entire surface of the substrate, and a second implantation of oxygen ions ($O^+$) is carried out in regions intended to become isolated regions. A thermal annealing treatment, preferably under encapsulation, follows these ion implantations. These implantations are carried out in order to obtain at the surface of the substrate regions of n-conductivity type isolating regions separated from each other for subsequent manufacture of semiconductor devices. The invention also relates to a gallium arsenide substrate thus treated and to a semiconductor device obtained by the technique of two ion implantations.

7 Claims, 6 Drawing Figures

METHOD OF MANUFACTURING A SEMICONDUCTOR DEVICE OF GAAS BY TWO SPECIES ION IMPLANTATION

The invention relates to a method of manufacturing a semiconductor device having a semiconductor body of gallium arsenide, in which a semi-insulating substrate of gallium arsenide is provided on one side with an n-type gallium arsenide layer, after which by implantation of oxygen ions isolating regions are formed, the isolating regions extending at least to the semi-insulating substrate region and dividing the gallium arsenide layer in mutually isolated islands, and semiconductor layer circuit elements are formed in the islands. It further relates to a substrate obtained by this method and to a semiconductor device realized with the use of this substrate.

BACKGROUND OF THE INVENTION

The invention is concerned with the electronic field and especially with the technologies of manufacturing of semiconductor devices.

A method is known from the prior art, more particularly from the French Patent Application No. 2,180,540, by means of which semiconductor devices are manufactured by implantation of oxygen ions in an epitaxial layer deposited preliminarily on a substrate so that isolating zones are formed having a depth which exceeds that of the epitaxial layer.

However, the effects of such an implantation in an arbitrary substrate of GaAs or in an epitaxial layer deposited on such a substrate are strongly dependent upon the initial conditions, for example, the initial doping of the substrate, and these known methods of manufacturing semiconductor devices by ion implantation involve the rejection of a very large number of wafers which are not suitable for the use for which they are intended.

Moreover, the technology developed in the aforementioned patent is comparatively complex because it is based on the assumption that two different incompatible treatments have to be carried out, i.e. a first treatment comprising an epitaxial growth and a second treatment comprising an ion implantation.

SUMMARY OF THE INVENTION

The invention has for its object to provide a method of treatment of a substrate (or wafer) of GaAs, which is more reliable and less complex and the use of which by a manufacturer does not adversely affect the manufacturing cost.

The method of treatment according to the present invention is characterized in that by a first implantation of silicon ions in the entire surface of the semi-insulating substrate said n-type gallium arsenide layer is formed, and in that by a second selective implantation of oxygen ions isolating regions are formed, after which the semiconductor body is subjected to a heat treatment.

Thus, it is now possible to measure in a simple and especially automatized manner the profile C(V) at several points of the wafer thus treated (cartography) after the first ion implantation and to make sure roughly that the wafer satisfies the requirements preliminarily defined and, if necessary, to reject the wafer, while upto this stage the cost of treating this wafer still is not very high.

Furthermore, it is much simpler to carry out a double implantation than to carry out an epitaxial growth and a single implantation, as described in the aforementioned prior patent, and moreover the wafers obtained by means of this known method are often too inhomogeneous to be used in the manufacture of integrated circuits.

In order to obtain the n-conductivity type in a substrate of GaAs, from the different possible implants of the list comprising Si, Se, S and Te the applicants have decided to select silicon for the following reasons:

the tellurium ion is too voluminous and its implantation causes too much damage in the crystalline matrix, the sulfur ion (S) diffuses too strongly during the subsequent sintering process.

Thus, the choice is limited to the couple (Si-O) or (Se-O). The experience of the applicants have shown the surprising effect that this first implant couple (Si-O) is approximately hundred times more efficient than this second implant couple (Se-O), that is to say, that a hundred times smaller does of oxygen would be required to obtain the same degree of insulation than in the case of a first Se implant.

BRIEF DESCRIPTION OF THE DRAWING

The following description with reference to the accompanying drawings, given by way of non-limiting example, permits understanding more clearly how the invention is realized.

DESCRIPTION OF PREFERRED EMBODIMENTS

Figure 1:
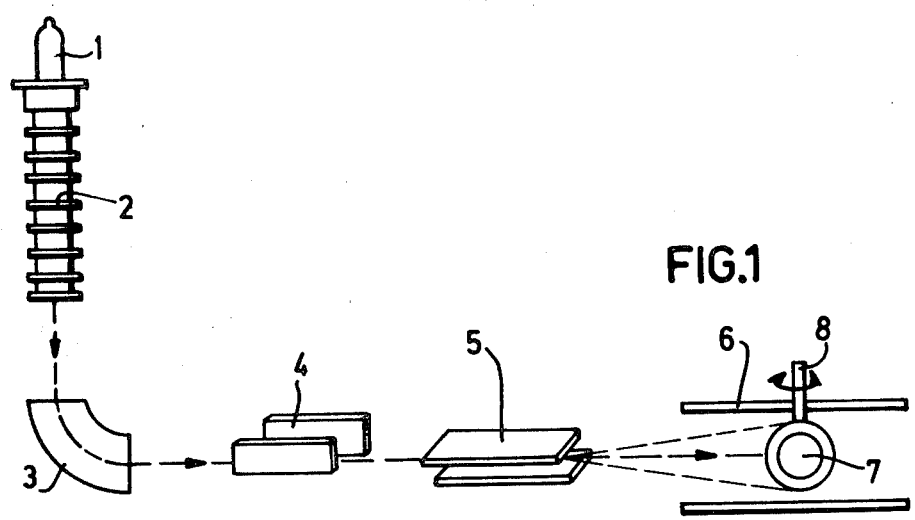
FIG. 1 shows a so-called Van de Graaf ion accelerator for implantation.

The device of the kind shown in FIG. 1 represents a Van de Graaf ion accelerator utilized in a usual manner for ion implantation in wafers of various materials and especially semiconductor wafers.

Such a device generally comprises an ion source 1, electrostatic means 2 for accelerating these ions, means 3 for separating the various ion species present in the beam, means 4 or 5 for causing the ions thus selected to deviate in a horizontal or vertical plane and finally a window 6 through which a substrate 7 can be visualized, disposed and displaced on a substrate support 8.

When an ion is accelerated by a considerable potential difference in an accelerator of the kind shown in FIG. 1 and penetrates through the surface of a wafer, a large number of effects are obtained.

On the one hand, the ion is localized in an aleatory manner in the crystalline matrix of the wafer at depths which are dependent upon its kinetic energy, upon the respective sizes of the implanted ions and of the atoms of the receiving matrix and which can be determined statistically by the Lindhard, Scharff and Schiott (LSS) tables (Hansted Press, John Winley & Sn Inc., 2nd edition) which give the parameters of the Gaussian distribution, i.e. the theoretical curve of the implantation profile.

On the other hand, the presence of foreign atoms will modify considerably the electric conductivity of the wafer, especially when a semiconductor material is concerned. Thus, for example, in a semi-insulating wafer of GaAs the implantation of silicon ions (Si+) or selenium ions (Se+) in sufficient quantities renders this wafer n-conducting, whereas the implantation of beryllium ions (Be+) renders the wafer p-conducting.

The method of treatment according to the invention will be described with reference to FIGS. 2 to 6, the corresponding parts of which are designated by the same reference numerals.

Figure 2:
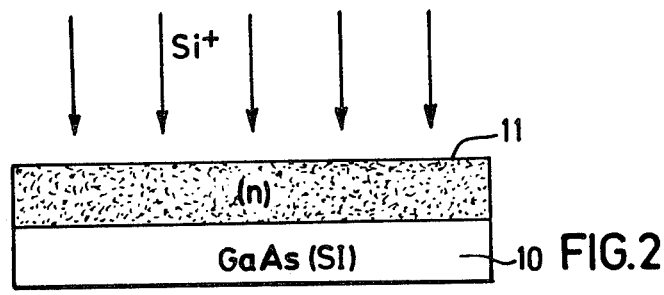
FIGS. 2 to 6 show various stages of the method according to the present invention and of the measuring operations to be effected.
Figure 3:
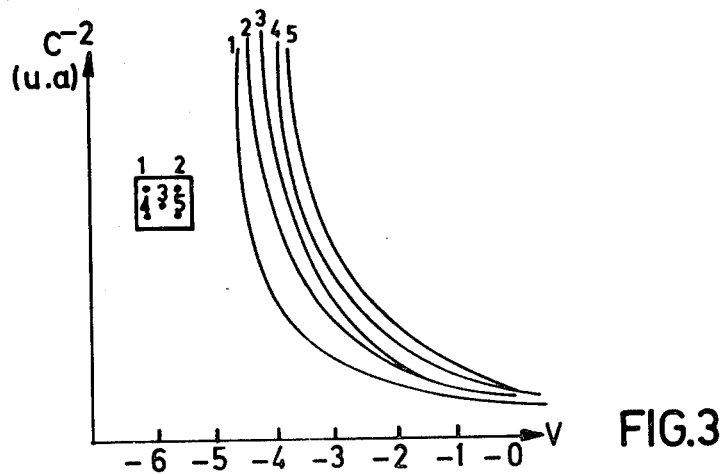
Figure 4:
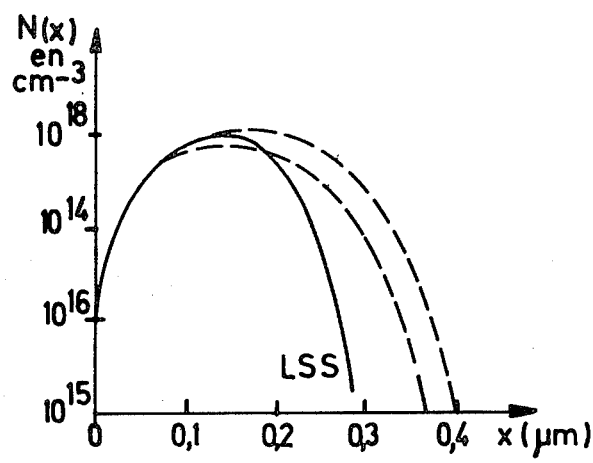

Starting from a wafer, denoted by 10 in FIG. 2, of gallium arsenide of the semi-insulating type obtained, for example, by an initial chromium doping during the processing according to the Bridgman method, there are implanted uniformly on the whole surface 11 of the wafer silicon ions (Si+) with an ion beam the flux of which lies approximately between $10^{12}$ and $5 \cdot 10^{12}$ ions·cm$^{-2}$ and a kinetic energy of 50 to 500 keV, which yields a theoretical penetration depth, calculated from the tabulated values of LSS, between 0.1 and 1 micrometer ($\mu$um).

It is then possible to carry out a measurement of the profiles C(V) (FIG. 3) by means of a well known automatized method, such as the double mercury ball technique described, for example, in "Electronics Letters" no. 11, 580 (1975) in the article "Fast and non-destructive method of C(V) profiling of a thin semiconductive layer on an insulating substrate" by M. Binet.

From these cartographic measurements of the capacity - voltage characteristics, corresponding doping profiles (FIG. 4) are derived, that is to say the density of free carriers N(x) (in cm$^{-3}$) as a function of the depth, which slightly deviates from the calculated theoretical Gaussian distribution.

After this simple and inexpensive test it is possible to reject the wafer as not suitable (inhomogeneity, too low free carrier density) or to retain it, while moreover it is possible to deduce from this test with close approximation the flux to which the wafer has to be subjected during the following ion bombardments.

Figure 5:
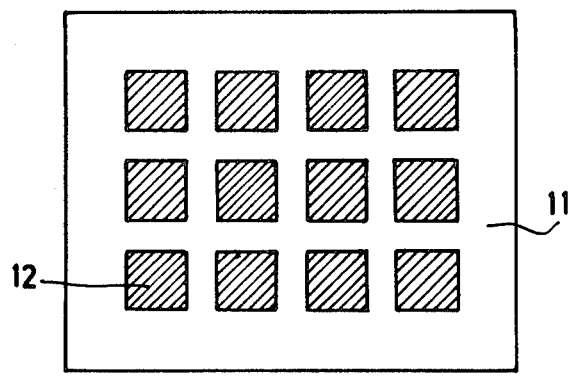
Figure 6:
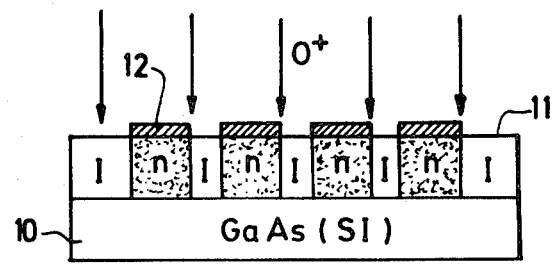

The following stage of the method shown in FIG. 5 consists in that a partial masking is obtained by means of a photosensitive lacquer 12 having an average thickness in the micrometer range according to a photo-etching technique known per se.

Subsequently, oxygen ions (0+) are implanted with a dose about ten times higher between approximately $10^{13}$ and $5 \cdot 10^{13}$ ions·cm$^{-2}$ and an energy between 50 and 500 keV. At the areas not coated with lacquer, the implantation of oxygen ions with this dose renders the implanted region insulating and a structure is obtained, for example, of the kind shown in FIG. 6 in which isolating regions (I) separate n-type regions for the manufacture of a plurality of elementary cells on the same wafer.

Such a manufacturing method thus may lead to a very high integration density such that large scale integration circuits (LSI) can be obtained having circuit complexities which are higher than 100 logic gates per wafer.

The subsequent stage of the method consists in that a thermal treatment is carried out so that the layer is activated (in order to allow the passage of the implanted atoms from an interstitial position to a substitutional position in the crystalline receiving matrix) and the defects caused by the bombardment are restored. This thermal treatment is effected at temperatures of the order of 700° C. to 900° C. during about 15 minutes and preferably under encapsulation so that evaporation of the constituents of the crystal (especially arsenic) is avoided. Various encapsulations are possible, such as alumina (Al$_2$O$_3$), silica (SiO$_2$) or silicon nitride (Si$_3$N$_4$) . . .; preferably, the latter material is used by the applicants in a thickness of a few tens of nm obtained by reaction between silane and ammoniac in an atmosphere which is as free from oxygen as possible.

However, in various possible applications of the invention, in which supplementary ion implantations are necessary in order to form circuit elements in the isolated islands obtained by the method according to the invention, the thermal treatment of the wafer may be carried out at the end of the implantation stages.

Thus, for example, for the manufacture of transistors of the JFET type (= "Junction Field Effect Transistors"), it is necessary to implant another ion which causes an inverse conductivity type, for example, beryllium for the p-conductivity type. In this case, the preliminary determination of the concentration of free carriers permits determining very accurately the flux of implants and the energy thereof, especially in the case of JFET transistors which are normally cut off, in which the junction is particularly deep and the respective densities of the free carriers are very difficult to adjust.

The advantage of the implantation of the ion couple (silicon-oxygen) with respect to other known implants intended to render the implanted region of gallium arsenide insulating, such as e.g. proton bombardment, is especially due to the fact that in this case annealing temperatures of more than 800° C. are permitted, whereas the insulation obtained by e.g. proton bombardment disappears at temperatures of more than 350° C.

It is obvious that many modifications of the invention can be imagined by those skilled in the art without departing from the scope of the invention described above and defined in the appended claims.

What is claimed is:

1. A method of manufacturing a seimconductor device comprising the steps of
   providing a semi-insulating substrate of gallium arsenide,
   implanting silicon ions into a first surface of said substrate to form an N-type gallium arsenide layer,
   selectively implanting oxygen ions into said N-type layer to form isolated regions extending through said layer to said substrate, said isolated regions dividing said N-type layer into mutually isolated islands to form locations for semiconductor circuit elements, and
   subjecting the semiconductor body thus formed to a heat treatment.

2. A method according to claim 1, wherein said heat treatment is carried out under an encapsulation layer covering said semiconductor body.

3. A method according to claim 1, wherein said implantation of silicon ions is carried out with a dose of between $10^{12}$ and $5 \times 10^{12}$ silicon ions per cm$^2$, and with an energy of between 50 KeV and 500 KeV.

4. A method according to claim 1, wherein said implantation of oxygen ions is carried out with a dose of between $10^{13}$ and $5 \times 10^{13}$ oxygen ions per cm$^2$, and with an energy of between 50 KeV and 500 KeV.

5. A method according to claim 2, wherein said implantation of silicon ions is carried out with a dose of between $10^{12}$ and $5 \times 10^{12}$ silicon ions per cm$^2$, and with an energy of between 50 KeV and 500 KeV.

6. A method according to claim 2, wherein said implantation of oxygen ions is carried out with a dose of between $10^{13}$ and $5 \times 10^{13}$ oxygen ions per cm$^2$, and with an energy of between 50 KeV and 500 KeV.

7. A method according to claim 2, wherein said heat treatment is carried out under an encapsulation layer of silicon nitride at temperatures between 700° C. and 900° C. for approximately 15 minutes in a nitrogen atmosphere.

* * * * *

UNITED STATES PATENT AND TRADEMARK OFFICE
CERTIFICATE OF CORRECTION

PATENT NO. : 4,469,528
DATED : September 4, 1984
INVENTOR(S) : Michael Berth, Camille Venger, Gerard Martin It is certified that error appears in the above-identified patent and that said Letters Patent is hereby corrected as shown below:

Column 2, line 17, change "does" to --dose--

*Signed and Sealed this*

*Twenty-second* Day of *October 1985*

[SEAL]

*Attest:*

DONALD J. QUIGG

*Attesting Officer*

Commissioner of Patents and Trademarks—Designate